United States Patent

Shih et al.

[11] Patent Number: 5,815,463
[45] Date of Patent: Sep. 29, 1998

[54] FLEXIBLE TIME WRITE OPERATION

[75] Inventors: Jeng-Tzong Shih, Hsinchu; Chun Shiah, Taichung; Tah-Kang Joseph Ting, Hsinchu, all of Taiwan

[73] Assignee: Etron Technology, Inc, Hsin-Chu, Taiwan

[21] Appl. No.: 873,834

[22] Filed: Jun. 12, 1997

[51] Int. Cl.[6] .................................................... G11C 7/00
[52] U.S. Cl. .......................... 365/233; 365/194; 395/556
[58] Field of Search ................................. 365/233, 194, 365/227; 711/167; 395/556, 559

[56] References Cited

U.S. PATENT DOCUMENTS

| | | | |
|---|---|---|---|
| 4,734,880 | 3/1988 | Collins | 395/556 |
| 4,802,131 | 1/1989 | Toyoda | 365/233 |
| 4,945,516 | 7/1990 | Kashiyama | 365/233 |
| 4,970,418 | 11/1990 | Masterson | 365/233 |
| 4,970,687 | 11/1990 | Usami et al. | 365/233 |
| 5,014,245 | 5/1991 | Muroka et al. | 365/233 |
| 5,323,426 | 6/1994 | James et al. | 365/233 |
| 5,440,514 | 8/1995 | Flannagan et al. | 365/194 |
| 5,530,677 | 6/1996 | Grover et al. | 365/194 |
| 5,546,355 | 8/1996 | Raatz et al. | 365/233 |
| 5,568,445 | 10/1996 | Park et al. | 365/233 |
| 5,664,166 | 9/1997 | Isfeld | 395/556 |
| 5,751,644 | 5/1998 | Ansel et al. | 365/194 |

*Primary Examiner*—Tan T. Nguyen
*Attorney, Agent, or Firm*—George O. Saile; Stephen B. Ackerman

[57] ABSTRACT

Methods and circuits are disclosed for a semiconductor memory that allow one or more clock cycles per memory write operation, which allow the memory clock cycle time to be varied, and which minimize power dissipation. This is achieved by providing circuits that generate a minimum internal write time reference, independent of the chosen clock cycle time, so that a memory write cycle might take one clock cycle, or more than one clock cycle if the clock cycle is shortened.

19 Claims, 4 Drawing Sheets

FLEXIBLE TIME WRITE OPERATION

BACKGROUND OF THE INVENTION

1. Field of the Invention

The invention relates to the timing of a semiconductor memory, and more particularly, to memory circuits which allow the clock cycle time to be varied and which allow a flexible number of clock cycles for a memory write operation.

2. Description of the Related Art

Demands by system designers for increased performance of random access memories used in graphic applications have led to the development of the synchronous graphics random access memory (SGRAM) because it can operate at higher system clock frequencies than an asynchronous memory. The higher clock frequencies make it increasingly more difficult to meet the timing specifications because timing tolerances are becoming more critical. Meeting the specification for the write cycle is particularly critical since a minimum internal write time has to be guaranteed in order to insure that the correct data will be written into the selected memory cell on the write cycle.

U.S. Pat. No. 5,440,514 (Flannagan et al.) provides a delay locked loop circuit for a static random access memory (SRAM) which provides a delayed clock signal a predetermined time after a clock signal, for maintaining write margins.

U.S. Pat. No. 5,546,355 (Raatz et al.) describes a memory circuit which has a write pulse generator for generating a self-timed write pulse, independent of system clock frequency and system clock duty cycle. This invention assures that the write pulse has the same duration to guarantee a successful write, regardless of system clock changes or variations in the clock duty cycle.

U.S. Pat. No. 5,568,445 (Park et al.) discloses a synchronous dynamic random access memory (SDRAM) which allows for a variable adjustment of the write latency.

SUMMARY OF THE INVENTION

It is an object of the present invention to provide methods and circuits that allow one or more clock cycles per memory write operation.

Another object of the present invention is to allow the clock cycle time of a memory write operation to be selectable, and to be shorter than the minimum internal write time.

A further object of the present invention is to minimize power dissipation for write and to optimize the write time.

These objects have been achieved by providing a circuit that generates a minimum internal write time reference, independent of the chosen clock cycle time. This internal write time reference circuit signals to a flexible time write control circuit when the minimum write time, required for a write operation, has been reached, requiring one or more clock cycles, and when, therefore, the write operation can be ended.

DESCRIPTION OF THE PREFERRED EMBODIMENT

Figure 1A:
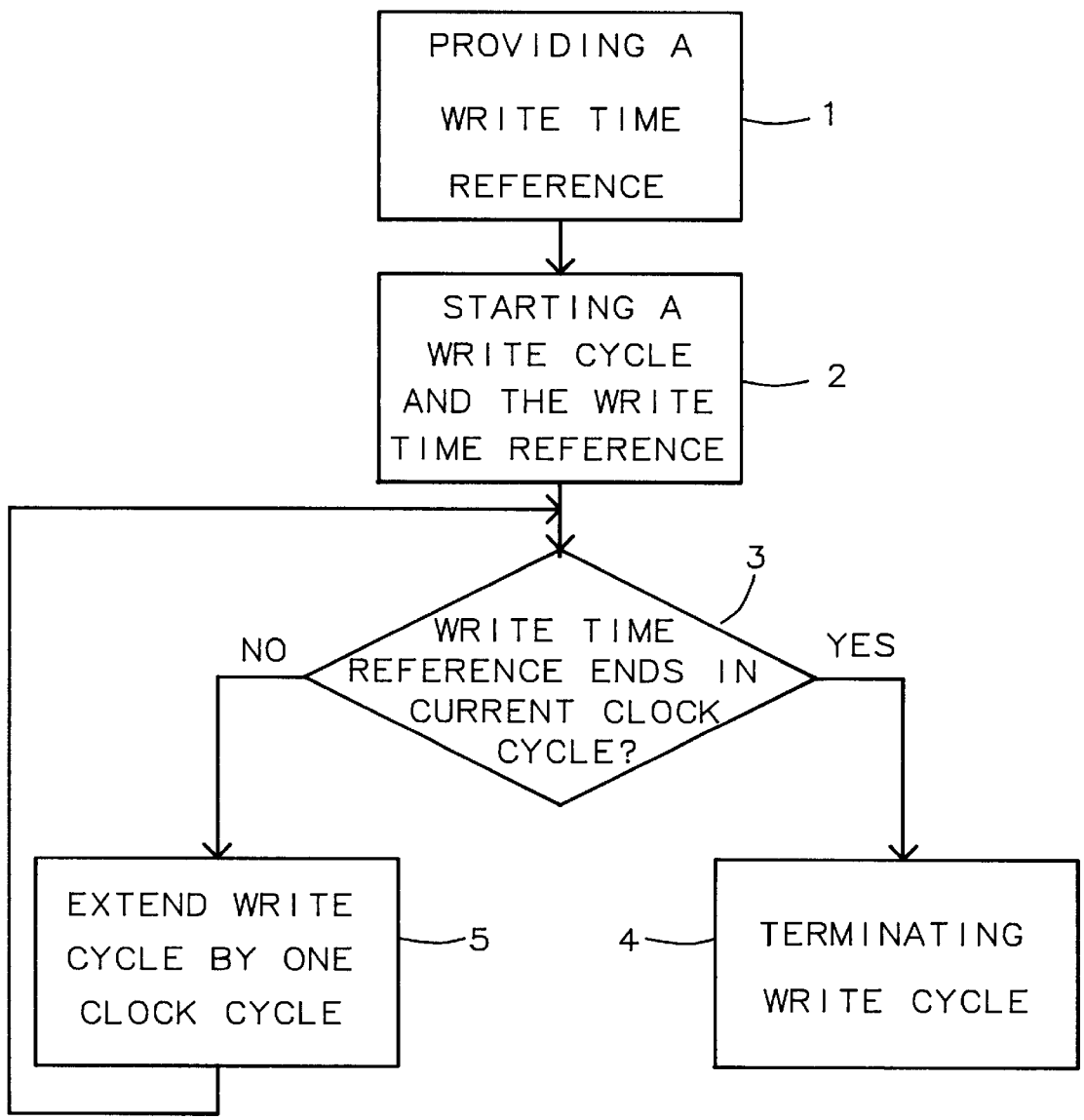
FIG. 1a is a flowchart illustrating the principal of the method of the present invention.

Referring now to FIG. 1a, we show a flowchart of the method of the present invention illustrating a flexible time write operation for a dynamic random access memory (DRAM). Block 1 provides a write time reference of fixed duration $T_W$ and which is equivalent to the minimum write time required for a successful write operation. A write cycle and the write time reference are started in Block 2 and begin at the rising edge of the first clock cycle. If $T_W$ has ended during the current clock cycle (Block 3), then the write cycle is completed and Block 4 terminates the write cycle at the end of the current clock cycle. If, however $T_W$ ended at the completion of the present clock cycle (end of clock cycle), then the write cycle will be extended by another clock cycle as illustrated in Block 5. It is, therefore, possible and indeed intended for the write cycle to take one, two, three or more cycles depending on the length of $T_W$ and the length of the clock cycle. See FIGS. 3, 4, and 5.

An illustrative example, not intended to relate to actual timings, is given. Assuming a minimum required write time $T_W$ of 8 ns the following total write times result (all in ns):

| cycle time ... | # of cycles ... | write time ... |
|---|---|---|
| 3 | 3 | 9 |
| 6 | 2 | 12 |
| 8 | 1 | 8 |
| 10 | 1 | 10 |
| 12 | 1 | 12 |

Conventionally the number of cycles for a block write operation is simply doubled resulting in SGRAM total write times of:

| cycle time ... | # of cycles ... | write time ... |
|---|---|---|
| 6 | 2 | 12 |
| 8 | 2 | 16 |
| 10 | 2 | 20 |
| 12 | 2 | 24 |

Figure 1B:
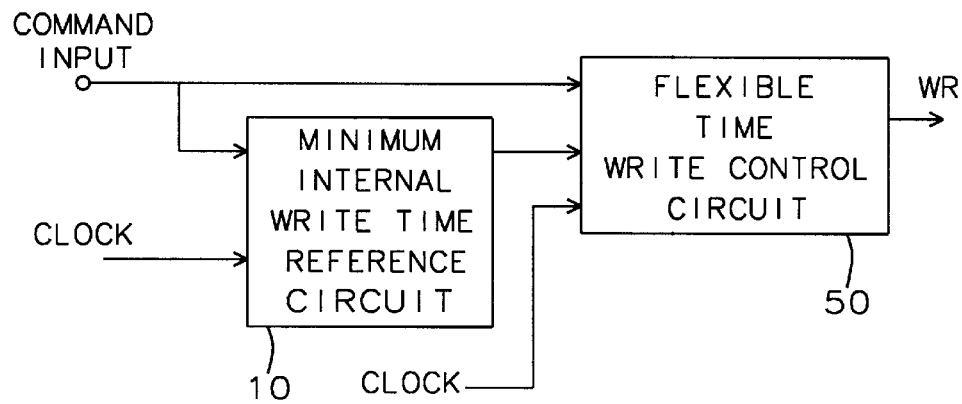
FIG. 1b is a high level block diagram of the present invention.

Referring now to FIG. 1b, we show a high level block diagram depicting the present invention. A flexible time write control circuit 50 decodes a write command on the command input bus and starts a write operation at the start of a clock cycle. The minimum internal write time reference circuit 10, also connected to the command input bus and to the system clock, terminates the write operation at the end of a clock cycle when the minimum internal write time $T_W$ has been satisfied in either the first or subsequent clock cycle. A single write may, thus take one cycle if the cycle time is larger than $T_W$ or it may take two or more cycles if the cycle time is shorter than $T_W$. Block 50, in addition to receiving an input from Block 10, also receives a system clock input. The number of clock cycles required for a write is expressed by the equation:

$$T_W/T_{CK}$$

rounded to the next higher integer, where $T_{CK}$ is the clock cycle time.

Figure 2:
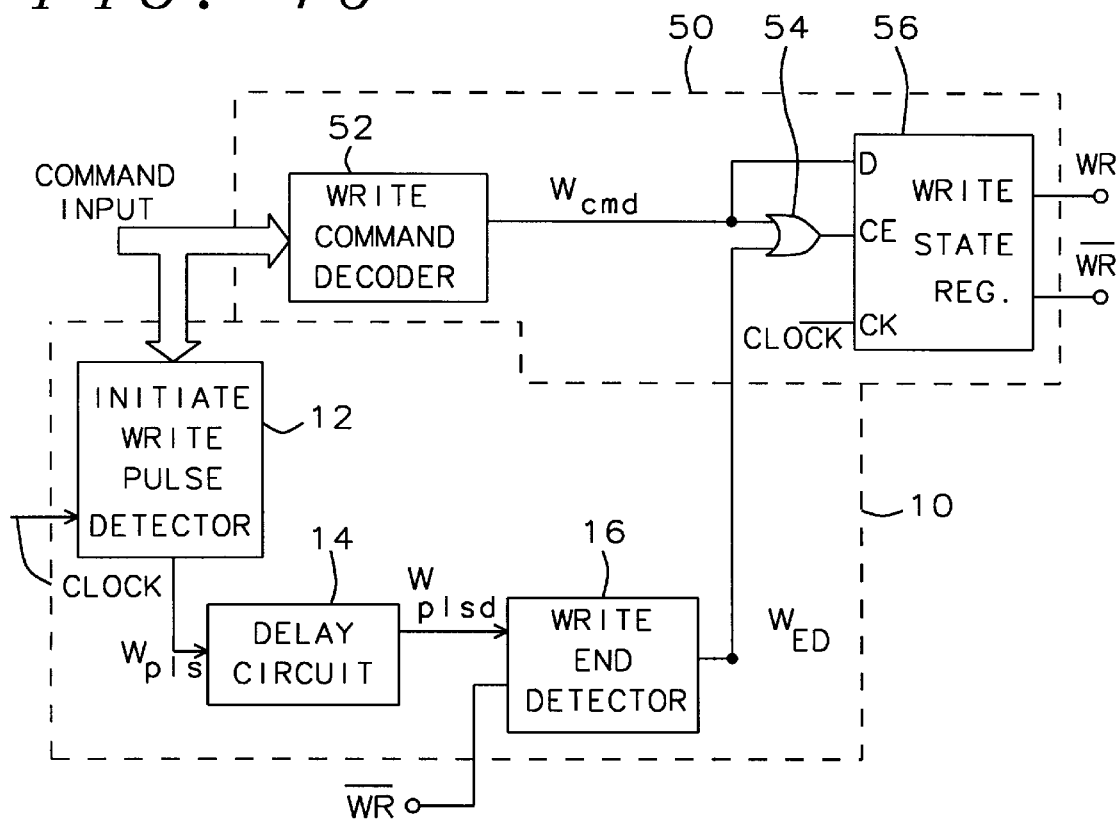
FIG. 2 is a detailed block diagram of the present invention.

Referring now to FIG. 2, we show a block diagram further explaining the method of the invention. Write command decoder 52 decodes a write operation when a write command is presented on the command input bus which consists of a plurality of signal lines providing logical one and logical zero voltage levels. The decoded write command $W_{cmd}$ feeds the data input D of write state register 56 and one input of OR gate 54.

Figure 6:
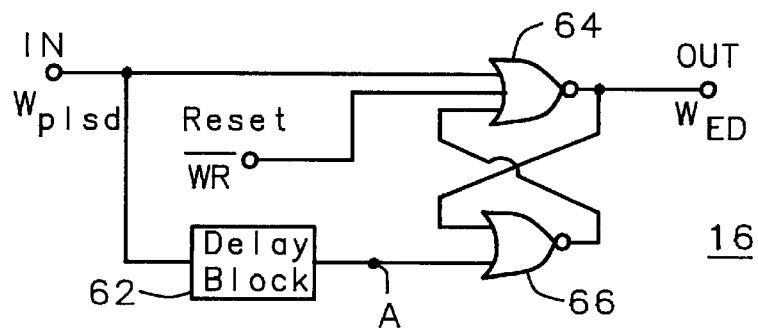
FIG. 6 is a circuit diagram of one of the blocks of FIG. 2.

The write command on the command input bus is also decoded by initiate write pulse detector 12, which generates signal $W_{pls}$. The clock for the write pulse detector is to synchronize $W_{pls}$ to the rising edge of the clock. $W_{pls}$ is the input to delay circuit 14 which delays this pulse by the time $T_W$. $T_W$ is a fixed delay and is equal to a minimum internal write time. The minimum internal write time assures adequate time for the write operation regardless of the cycle time. The minimum internal write time for the memory array and the delay $T_W$ of the delay circuit are affected in similar ways by process variations and, therefore, track each other. The delayed write pulse $W_{plsd}$ from Block 14 feeds the write end detector 16. It produces a positive going write end detected signal $W_{ED}$ from the falling edge of the delayed write pulse $W_{plsd}$. Block 16, which also has a reset input, is shown in FIG. 6 and will be explained in more detail later.

Signal $W_{ED}$ and signal $W_{cmd}$ feed OR gate 54, which connects to the second input CE of Block 56. CE is Chip Enable; when this input is logical zero Write state register 56 will keep the previous state. When input CE is at logical one the register will accept the logical value at input D. Write state register 56 is an edge triggered D flip-flop with three inputs. The third input CK is the main clock of the synchronous memory system. Inputs at D will show up at output WR when the clock goes positive. Output WR of Block 56 controls the write operation of the internal write circuitry (not shown). The inverse of that signal, denoted as Wr, is the reset input of Block 16, resetting write end detected signal $W_{ED}$. WR is shown as an output of Block 56, but may be produced using an inverter connected to output WR, as is commonly known.

Figure 3:
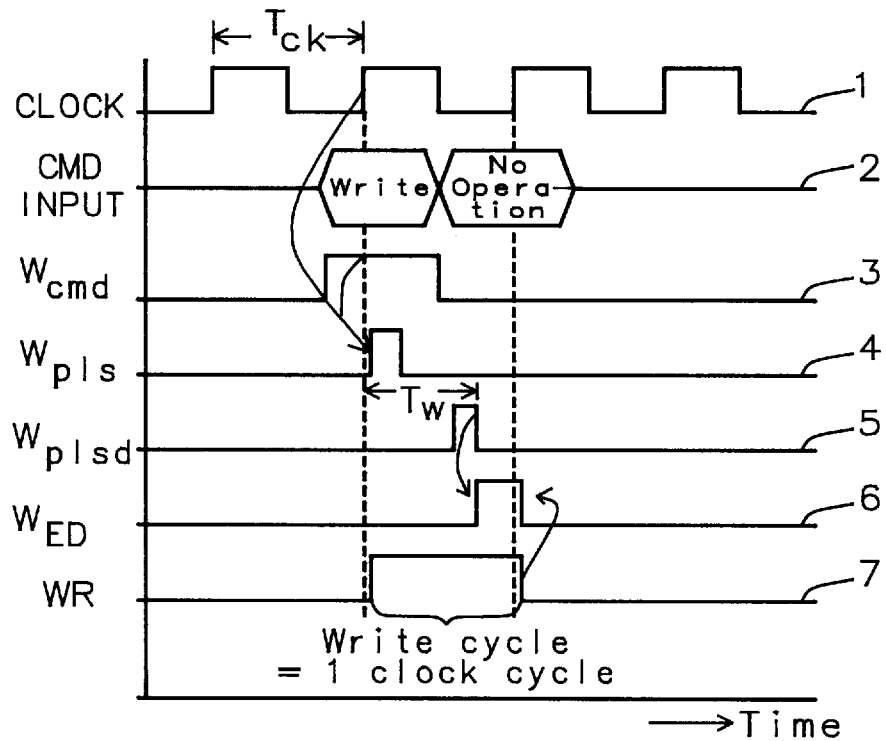
FIG. 3 is a view of the input and output signals of the block diagram as shown in FIG. 2 when the clock cycle is longer than the minimum internal write time $T_W$.

FIG. 3 depicts a timing diagram for the circuits just described when the clock cycle is longer than the minimum internal write time $T_W$. Curves 1 to 7 represent the clock, the command input, $W_{cmd}$, $W_{pls}$, $W_{plsd}$, $W_{ED}$, and WR respectively. The timing sequence depicts a write followed by a "no operation". In FIG. 3 the clock cycle is longer than the minimum internal write time $T_W$, i.e. the write cycle is accomplished in one clock cycle.

In CMOS circuits, the power dissipation for write is very small when the write signal on the bit lines has reached full swing (after the minimum internal write time). In the present invention the power dissipation for a write is self-minimized, because it is limited by the minimum internal write time and is not dependent on the clock cycle time.

When the clock cycle time is larger than the minimum internal write time, the write time will be extended to the clock cycle time. This makes the write operation more complete, because in a DRAM memory the electric charge (representing data) stored in a memory cell is then larger. This improves the refresh time and $T_{rcd}$ (RAS to CAS delay).

Figure 4:
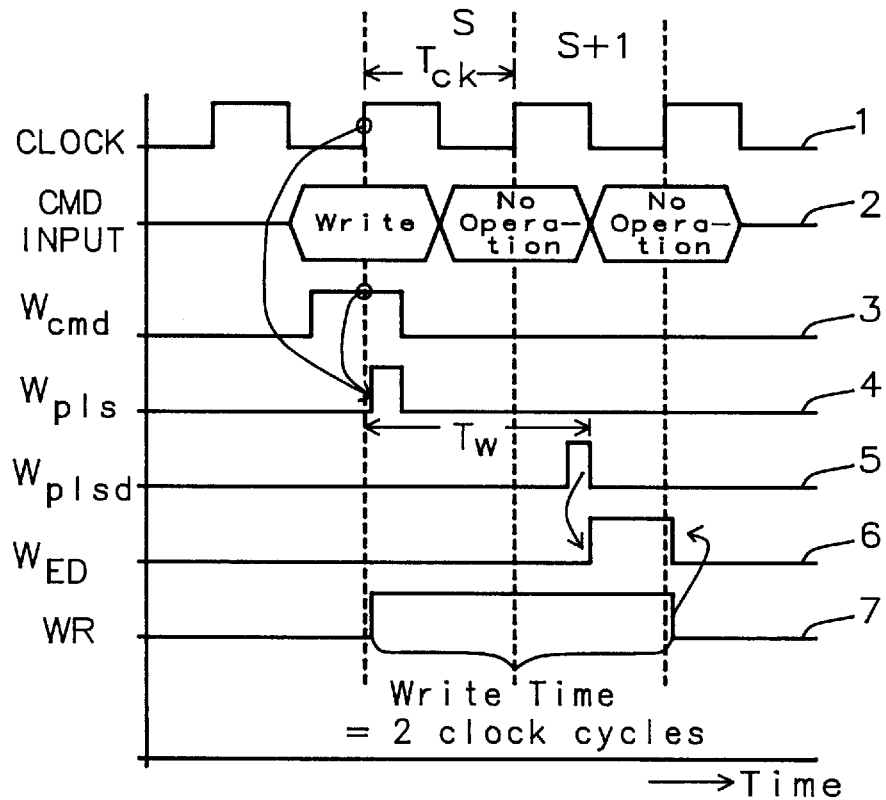
FIG. 4 is a view of the input and output signals of the block diagram as shown in FIG. 2 when the clock cycle is shorter than the minimum internal write time $T_W$.

Next is discussed the invention, as shown in FIG. 2 and already described, where the clock cycle is shorter than the minimum internal write time $T_W$. Refer to FIG. 4 for the timing diagram. Curves 1 to 7 represent the clock, the command input, $W_{cmd}$, $W_{pls}$, $W_{plsd}$, $W_{ED}$, and WR respectively. The timing sequence shows a write followed by two "no operations". Note that the duration of the clock cycle $T_{ck}$ in FIGS. 3 and 4 is not to scale. The clock cycle in FIG. 3 is longer than the clock cycle in FIG. 4. After receiving a write command, Block 10 and Block 50 follow the same sequence of starting the write operation in say clock cycle S, except that the delayed write pulse $W_{plsd}$ now rises in the next clock cycle following S, namely S+1. Similarly write end detected signal $W_{ED}$ also rises in clock cycle S+1. Next, $W_{ED}$ resets write enable signal WR at the end of clock cycle S+1 because $W_{cmd}$, Curve 3, is at logical zero. (Note that WR was not reset at the rising edge of cycle S+1. This is because $W_{cmd}$ (Curve 3) and $W_{ED}$ (Curve 6) are at logical zero. That puts the Chip Enable (CE) input of the Write State Register at logical zero and, therefore, holds the previous state.).

FIG. 4 demonstrates how one write operation takes two clock cycles. FIG. 4 also demonstrates that, if the clock cycle is shortened some more, $W_{plsd}$ and $W_{ED}$ will fall into the clock cycle following S+1. Equally, WR will be reset in the clock cycle following S+1. One write cycle may, therefore, take one or more clock cycles depending on the duration of the clock with respect to the minimum internal write time $T_W$. It is understood that all clock cycles are of equal duration.

Figure 5:
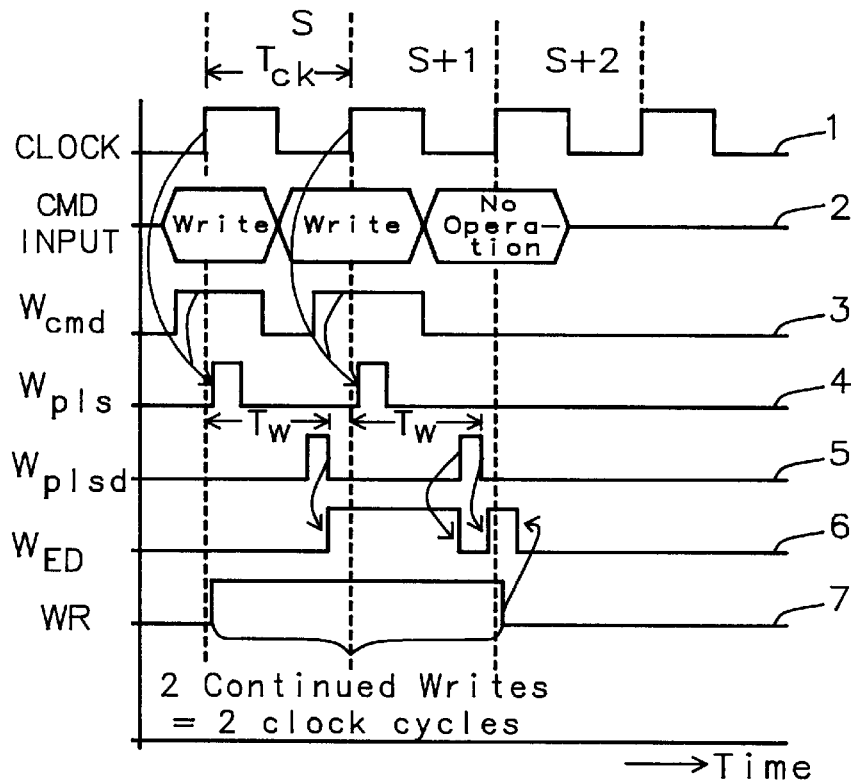
FIG. 5 is a view of the input and output signals of the block diagram as shown in FIG. 2 when the clock cycle is longer than the minimum internal write time $T_W$ and when two write cycles follow each other.

Next follows a description of the circuit of the invention when the clock cycle is longer than the minimum internal write time $T_W$, but when two write cycles follow each other. Refer to FIG. 5 (two successive writes and a "no operation"), where Curves 1 to 7 represent the clock, the command input, $W_{cmd}$, $W_{pls}$, $W_{plsd}$, $W_{ED}$, and WR respectively. The first write follows the sequence as discussed above and illustrated in FIG. 3. After decoding the first write command from the command input bus, a write enable signal WR and a first initiate write pulse $W_{pls}$ are produced in a clock cycle S, and a first delayed write pulse $W_{plsd}$ is generated in clock cycle S. First $W_{plsd}$ produces a first write end detected signal $W_{ED}$, also in clock cycle S. One cycle after the first write on the command input bus a second write follows. A second $W_{cmd}$, a second initiate write pulse $W_{pls}$, and a second delayed write pulse $W_{plsd}$ follow once cycle after the first set of pulses. WR stays up at the beginning of clock cycle S+1 because the second $W_{cmd}$, setting WR, overrides the reset by $W_{ED}$. $W_{ED}$ is reset towards the end of cycle S+1 by the rise of the second $W_{plsd}$ only to be set again when $W_{plsd}$ falls (Curves 5 and 6). Write enable signal WR (Curve 7) is reset at the end of cycle S+1 since Curve 3 is at a logical zero and Curve 6 is at a logical one ($W_{ED}$ up) . WR falling, resets $W_{ED}$ (Curve 6).

As demonstrated, this invention allows two or more successive writes to be performed in successive clock cycles, where each clock cycle is longer than or equal to the minimum internal write time $T_W$. Single writes may be performed when the clock cycle is shorter than the minimum internal write time $T_w$ and may then take more than one clock cycle.

Figure 7:
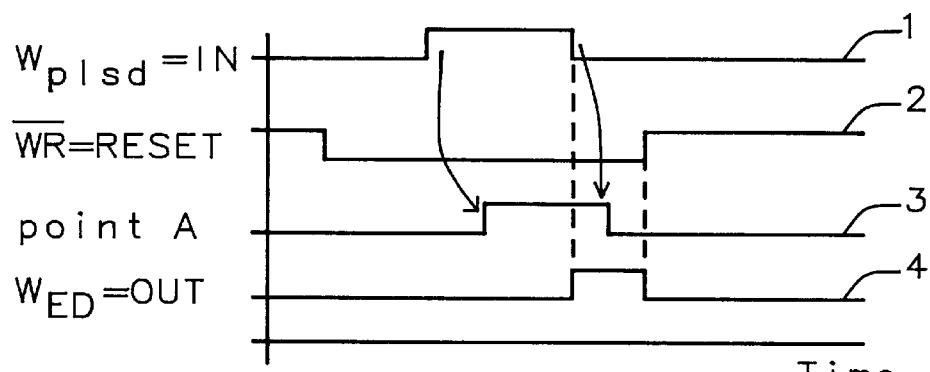
FIG. 7 is a view of the input and output signals of the circuit as shown in FIG. 6.

Referring now to FIG. 6, we describe a preferred embodiment of write end detector 16. The "IN" terminal, or $W_{plsd}$ connects to a delay block 62 and to a first NOR gate 64. The output of delay block 62, point A, and the output of NOR gate 64 feed the two inputs of a second NOR gate 66. Another input to write end detector 16, Reset or WR, connects to a second input of NOR gate 64. A third input to NOR gate 64 is connected to the output of NOR gate 66. The output of NOR gate 64 also goes to the "OUT" terminal, or $W_{ED}$. The circuit described is a falling edge detector and a SR flip-flop providing logical one voltage levels and logical zero voltage levels. The action of the circuit is shown in terms of input and output waveshapes in FIG. 7. When reset (WR) is active, OUT, Curve 4, is forced to logical zero. OUT stays at zero until IN, Curve 1, drops. As IN drops, and because point A, Curve 3, is still up, OUT rises to a logical one. OUT stays at logical one even though A drops a short time later because the "1" is latched up internally. When reset, Curve 2, rises the flip-flop is reset and OUT drops. The advantage of this embodiment is its small propagation delay of only one logic block from input to output.

The invention as presented eliminates the disadvantage of the prior art of being limited to a fixed clock cycle time and of a large power dissipation during consecutive write operations. The present invention offers the advantages of flexibility in choosing a clock cycle time that optimizes performance by not requiring doubling of the number of write cycles and minimizes power dissipation.

While the invention has been particularly shown and described with reference to the preferred embodiments thereof, it will be understood by those skilled in the art that various changes in form and details may be made without departing from the spirit and scope of the invention.

What is claimed is:

1. A method of allowing a flexible time write operation in a semiconductor memory, comprising:

providing a write time reference of duration $T_W$, representing a minimum write time for a write operation;

initiating a write cycle at the start of a first clock cycle;

terminating said write cycle at the end of a clock cycle when said write time reference ends, where said clock cycle may be said first clock cycle or a subsequent clock cycle.

2. A method of allowing a flexible time write operation in a semiconductor memory, comprising:

decoding a write command from a command input bus;

producing a write enable signal WR from said write command to start said write operation at the start of a clock cycle;

generating after a delay a delayed write pulse $W_{plsd}$ after decoding said write command, where said delay is equal to a minimum internal write time;

producing a write end detected signal $W_{ED}$ from said delayed write pulse $W_{plsd}$; and resetting said write enable signal WR at the end of a clock cycle when said write end detected signal $W_{ED}$ is produced, thus ending said write operation.

3. A method of allowing a flexible time write operation in a semiconductor memory, comprising:

decoding a write command from a command input bus;

producing a write enable signal WR from said write command to start said write operation at the start of a clock cycle S;

generating after a delay a delayed write pulse $W_{plsd}$ after decoding said write command, where said delay is equal to a minimum internal write time, said delayed write pulse $W_{plsd}$ rising in a clock cycle S+1;

producing a write end detected signal $W_{ED}$ from said delayed write pulse $W_{plsd}$; and resetting said write enable signal WR at the end of said clock cycle S+1, thus ending said write operation.

4. The method of claim 3, wherein said clock cycle S is shorter than said minimum internal write time.

5. The method of claim 3, wherein said write enable signal WR extends over two clock cycles.

6. The method of claim 3, wherein said clock cycle S+1 immediately follows said clock cycle S.

7. The method of claim 3, wherein said clock cycle S+1 is equal in duration to said clock cycle S.

8. A method of allowing a flexible time write operation in a semiconductor memory, comprising:

decoding a plurality of write commands from a command input bus on successive clock cycles;

producing a plurality of write enable signals WR from said plurality of write commands to start on successive clock cycles a plurality of write operations beginning with clock cycle S;

generating after a delay a plurality of delayed write pulses $W_{plsd}$ on successive clock cycles after decoding said plurality of write commands, where said delay is equal to a minimum internal write time; and producing a plurality of write end detected signals $W_{ED}$ on successive clock cycles from said plurality of delayed write pulses $W_{plsd}$.

9. The method of claim 8, wherein said clock cycle S is longer than said minimum internal write time.

10. A flexible time write circuit in a semiconductor memory, comprising:

a minimum internal write time reference circuit receiving a write command and producing a write end pulse, after a delay of time $T_W$, said delay $T_W$ representing a minimum write time for a write operation;

a flexible time write control circuit receiving a clock signal, said write command, and said write end pulse, said control circuit producing a write signal as an output at a rising edge of a first clock cycle, said control circuit terminating said write signal when said write end pulse is received by said write control circuit at a falling edge of said first clock cycle or a subsequent clock cycle.

11. A flexible time write circuit in a semiconductor memory, comprising:

a command input with a plurality of signal lines, said signal lines providing logical one and logical zero voltage levels;

a write command decoder with a plurality of inputs and an output, said write command decoder decoding a write command, said plurality of inputs of said write command decoder connected to said command input;

an initiate write pulse detector with a plurality of inputs, a clock input, and an output, said initiate write pulse detector generating an initiate write pulse, said plurality of inputs of said initiate write pulse detector connected to said command input, and said clock input of said initiate write pulse detector connected to a clock signal;

a delay circuit with an input and an output, said delay circuit delaying said initiate write pulse, said input of said delay circuit connected to said output of said initiate write pulse detector;

a write end detector with a first input, a second input, and an output, said output of said write end detector producing a logical one and logical zero voltage level, said first input of said write end detector connected to said output of said delay circuit;

a logic gate with a first input, a second input, and an output, said output of said logic gate providing a chip enable signal, said first input of said logic gate connected to said output of said write command decoder, said second input of said logic gate connected to said output of said write end detector; and a write state register, with a first input, a second input, a third input, a first output, and a second output, said first input of said write state register connected to said output of said write command decoder, said second input of said write state register connected to said output of said logic gate, said third input of said write state register connected to said clock signal, said first output of said write state register providing a write pulse WR to an internal write circuit, and said second output of said write state register connected to said second input of said write end detector.

12. The circuit of claim 11, wherein said write end detector further comprises:

a delay block with an input and an output, said input of said delay block connected to said first input of said write end detector;

a first NOR gate with a first input, a second input, a third input, and an output, said first input of said first NOR gate connected to said first input of said write end detector, said second input of said first NOR gate connected to said second input of said write end detector, and said output of said first NOR gate connected to said output of said write end detector; and a second NOR gate with a first input, a second input, and an output, said first input of said second NOR gate connected to said output of said first NOR gate, said second input of said second NOR gate connected to said output of said delay block, and said output of said second NOR gate connected to said third input of said first NOR gate.

13. The circuit of claim 11, wherein said logic gate is an OR gate.

14. The circuit of claim 11, wherein said write state register comprises an edge triggered D-type flip flop.

15. The circuit of claim 11, wherein said first input of said write state register is a data input.

16. The circuit of claim 11, wherein said second input of said write state register is a chip enable input.

17. The circuit of claim 11, wherein said third input of said write state register is a clock input.

18. The circuit of claim 11, wherein said second output of said write state register provides an inverse signal to that of said first output of said write state register.

19. The circuit of claim 11, wherein said write end detector has a delay of one logic gate from said first input of said write end detector to said output of said write end detector.

* * * * *